(12) United States Patent
Thomas et al.

(10) Patent No.: US 7,084,059 B2
(45) Date of Patent: Aug. 1, 2006

(54) CMP SYSTEM FOR METAL DEPOSITION

(75) Inventors: Terence M. Thomas, Newark, DE (US); Joseph K. So, Newark, DE (US)

(73) Assignee: Rohm and Haas Electronic Materials CMP Holdings, Inc., Wilmington, DE (US)

( * ) Notice: Subject to any disclaimer, the term of this patent is extended or adjusted under 35 U.S.C. 154(b) by 0 days.

(21) Appl. No.: 10/347,831

(22) Filed: Jan. 21, 2003

(65) Prior Publication Data
US 2003/0166339 A1 Sep. 4, 2003

Related U.S. Application Data

(62) Division of application No. 09/952,268, filed on Sep. 14, 2001, now abandoned.

(60) Provisional application No. 60/233,018, filed on Sep. 15, 2000.

(51) Int. Cl.
*H01L 21/44* (2006.01)

(52) U.S. Cl. ............... 438/674; 438/675; 438/678; 438/687; 438/695; 438/697; 438/699; 438/700

(58) Field of Classification Search ........ 438/674–675, 438/678–679, 681, 687, 690–692, 694–695, 438/697, 699–700, 702–703
See application file for complete search history.

(56) References Cited

U.S. PATENT DOCUMENTS

| | | | | |
|---|---|---|---|---|
| 3,436,259 A | * | 4/1969 | Regh et al. ............ 438/692 |
| 4,563,217 A | * | 1/1986 | Kikuchi et al. ......... 106/1.23 |
| 4,576,685 A | * | 3/1986 | Goffredo et al. ........ 205/126 |
| 5,256,565 A | * | 10/1993 | Bernhardt et al. ........ 438/631 |
| 5,965,211 A | * | 10/1999 | Kondo et al. .......... 427/443.1 |
| 6,004,880 A | * | 12/1999 | Liu et al. ............... 205/157 |
| 6,056,864 A | * | 5/2000 | Cheung ................. 205/222 |
| 6,090,239 A | * | 7/2000 | Liu et al. ............. 156/345.12 |
| 6,110,011 A | * | 8/2000 | Somekh et al. ........... 451/28 |
| 6,121,152 A | * | 9/2000 | Adams et al. ........... 438/697 |
| 6,132,586 A | * | 10/2000 | Adams et al. ........... 205/123 |
| 6,143,155 A | * | 11/2000 | Adams et al. ............ 205/87 |
| 6,176,992 B1 | * | 1/2001 | Talieh ................. 205/657 |
| 6,225,223 B1 | * | 5/2001 | Liu et al. .............. 438/687 |
| 6,313,039 B1 | * | 11/2001 | Small et al. ............ 438/693 |
| 6,341,998 B1 | * | 1/2002 | Zhang .................. 451/288 |
| 6,354,916 B1 | * | 3/2002 | Uzoh et al. ............. 438/692 |
| 6,355,153 B1 | * | 3/2002 | Uzoh et al. ............. 205/87 |
| 2002/0084529 A1 | * | 7/2002 | Dubin et al. ............ 257/774 |
| 2002/0146965 A1 | * | 10/2002 | Thomas et al. ........... 451/41 |
| 2003/0040188 A1 | * | 2/2003 | Hsu et al. .............. 438/697 |
| 2003/0164302 A1 | * | 9/2003 | Uzoh et al. ............. 205/125 |

* cited by examiner

*Primary Examiner*—Lynne A. Gurley
(74) *Attorney, Agent, or Firm*—Blake T. Biederman

(57) ABSTRACT

A system for dished metal redevelopment by providing a metal deposition solution at an interface between a moving semiconductor wafer and a moving polishing pad, which deposits metal onto dished metal in trenches in a layer of an interlayer dielectric; and by polishing the wafer with a relatively reduced polishing pressure to polish metal being deposited. A polishing fluid is disclosed for use in a CMP polishing system, the polishing fluid being a metal deposition solution for dished metal redevelopment.

10 Claims, 6 Drawing Sheets

```
DEKTAK V200SiVersion 7.46.020 ati
PROGRAM NAME: <Untitled>
SCAN ROUTINE # :    1
TIME OF SCAN    :    10:04:55 Mon Aug 28  200
DATA FILE NAME :    SLOT-13.001
Scan ID.........    0
Location........    105423µm,155207µm,176.291
Scan Length.....    1500µm
Resolution......    0.333 µm/sample
Stylus Force....    7.0 mg
R. Cursor.......    0Å @ 458.33µm
M. Cursor.......    -1091Å @ 1363.64µm
*Vert. Delta....    -1091Å
Horiz. Delta....    905.31µm
Filters.........    No
ANALYTIC FUNCTIONS:          R:µm; M:µm
Ra*    =      446Å           0.00    500.00
Rq*    =      467Å           0.00    500.00
Rp*    =      520Å           0.00    500.00
Rt*    =     1158Å           0.00    500.00
Ash    =    -1091Å         458.33   1363.64
Tir    =     1229Å         458.33   1363.64
```

FIG. 4

```
DEKTAK V200SiVersion 7.46.020 ati
PROGRAM NAME: <Untitled>
SCAN ROUTINE # :   1
TIME OF SCAN    :   10:49:55 Mon Aug 28   200
DATA FILE NAME  :   SLOT-13p.001
Scan ID.........   0
Location........   105423μm,155207μm,176.291
Scan Length.....   1500μm
Resolution......   0.333 μm/sample
Stylus Force....   7.0 mg
R. Cursor.......   0Å @ 246.442133μm
M. Cursor.......   3627Å @ 1367.42μm
*Vert. Delta....   3627Å
Horiz. Delta....   1121.21μm
Filters.........   No
ANALYTIC FUNCTIONS:              R:μm;  M:μm
Ra*      =      1897Å             0.00    500.00
Rq*      =      1996Å             0.00    500.00
Rp*      =      3515Å             0.00    500.00
Rt*      =      5604Å             0.00    500.00
Ash      =      3630Å           246.21   1367.42
Tir      =      6243Å           246.21   1367.42
```

FIG. 6

CMP SYSTEM FOR METAL DEPOSITION

CROSS REFERENCE TO RELATED APPLICATIONS

This application is a division of U.S. patent application Ser. No. 09/952,268, filed on Sep. 14, 2001, now abandoned, which claims the benefit of U.S. provisional patent application Ser. No. 60/233,018, filed Sep. 15, 2000.

FIELD OF THE INVENTION

The invention relates to a system for polishing a semiconductor wafer, and more particularly, to a system for polishing while minimizing metal dishing in trenches in a semiconductor wafer.

BACKGROUND OF THE INVENTION

A semiconductor wafer of silicon is manufactured with a layer of an interlayer dielectric, ILD, which can be a dielectric, such as, silica including $SiO_2$ and TEOS, and further, such as, a low K dielectric. The ILD is suitable as base on which multilevel integrated circuits are to be fabricated. Metal filled trenches are fabricated in the ILD, for example, by a damascene process. Metal, such as, copper, in the trenches, and provides circuit interconnects. A thin barrier film, for example, tantalum, meaning elemental tantalum or tantalum alloy including tantalum nitride, between the copper metal and the ILD, provides a barrier to migration of the metal into the ILD. The barrier film covers the surface of the ILD including the trenches. The barrier film and a thin film of the copper metal are deposited in succession, for example, by successive chemical vapor deposition processes, followed by an electroplating process for depositing copper metal to fill the trenches. Copper metal covers the barrier film, and fills the trenches to provide circuit interconnects. The successive layers of the barrier film and copper metal cause the wafer to have a topography of peaks and valleys that require polishing to achieve a polished planar surface that is suitable as a base for integrated circuits. The wafer may comprise a standard test wafer, on which are performed tests for the effectiveness of polishing operations.

The wafer is polished by a polishing system known as CMP, referred to as either or both, chemical-mechanical planarization and chemical-mechanical polishing. The CMP system moves the wafer against a moving polishing pad, and uses a combination of the moving polishing pad with polishing fluids at an interface with the wafer being polished, to remove the metal films by polishing pressure and chemical reaction of the metal films to the polishing fluid. According to accepted practices, a first step polishing operation is performed to remove the copper metal to the level of the underlying barrier film. Thereby, a test wafer is provided, having a top layer of barrier film, and further having trenches in an underlying ILD. The trenches contain metal that provide circuit interconnects. Further, the metal in the trenches are dished as a result of the first step polishing operation. The first step polishing operation is followed by a second step polishing operation that removes the barrier film to the surface of the underlying ILD, and which further results in the ILD being polished with a mirror-like, polished planar surface suitable for subsequent fabrication of integrated circuits. Further, the wafer is left with metal in the trenches to provide circuit interconnects. The metal in the trenches are dished as a result of being subjected to the second step polishing operation.

The CMP polishing system would desirably result in a polished planar wafer surface without residual metal films on the polished surface of the ILD, and with all of the trenches having metal at heights that are even with the level of the polished surface. However, chemical reaction and mechanical friction, applied by the polishing operation results in undesired removal of metal from the trenches, referred to as dishing. Further, the wafer can be subjected to excessive polishing, to ensure complete removal of metal from the ILD surface, which results in erosion of the ILD surface. Excessive polishing can cause undesired rounding of the corner edges of the trenches, altering critical dimensions of the circuit interconnects in the trenches.

A long existing need exists for a CMP system that minimizes, dishing of circuit interconnects in trenches, erosion of an ILD surface and rounding of corner edges of the trenches.

SUMMARY OF THE INVENTION

The invention pertains to a system for dished metal redevelopment, DMR, that minimizes dishing. The invention provides a system for dished metal redevelopment of a semiconductor wafer by moving a surface of the wafer against a moving polishing pad, the system comprising the steps of: providing a plating solution at an interface between the wafer and the polishing pad, which redevelops dished metal in dished trenches in an interlayer dielectric, ILD, of the wafer.

Dished metal redevelopment means that metal is deposited onto dished trenches, of a semiconductor wafer, by depositing metal onto the dished trenches; and polishing the wafer with a relatively reduced polishing pressure to polish the metal being deposited onto the dished trenches. The dished trenches contain dished metal resulting from previous manufacturing operations, such as, an electroplating process that has filled the trenches with metal, followed by a CMP polishing operation that has caused dishing of the dished metal in the dished trenches.

An advantage of the invention resides in depositing metal onto dished trenches to redevelop the dished metal in the dished trenches, which minimizes dishing. A further advantage resides in depositing metal onto dished trenches to redevelop the dished metal in the dished trenches, which minimizes dishing, while simultaneously polishing by a CMP process to polish the metal being deposited. A further advantage resides in depositing metal onto dished trenches to redevelop the dished metal in the dished trenches, which minimizes dishing, while simultaneously polishing a wafer by a CMP process to remove a layer of metal from an underlying surface, and to polish the underlying surface and the metal being deposited. According to further advantages of the invention, erosion of an ILD is minimized, and rounding of the trenches is minimized, when polishing the metal being deposited on dished trenches during a polishing operation.

A further aspect of the invention resides in, a polishing fluid for use in dished metal redevelopment by a CMP polishing operation wherein, a moving semiconductor wafer is urged against a moving polishing pad, the polishing fluid comprising: a metal deposition solution for depositing metal onto dished trenches in said wafer during said CMP polishing operation.

DESCRIPTION OF THE DRAWINGS

Embodiments of the invention will now be described by way of example with reference to the accompanying drawings, according to which;

FIG. 4 is a spreadsheet of the measurements shown graphically in FIG. 3;

FIG. 6 is a spreadsheet of the measurements shown graphically in FIG. 5;

DESCRIPTION OF THE EMBODIMENTS

Figure 1:
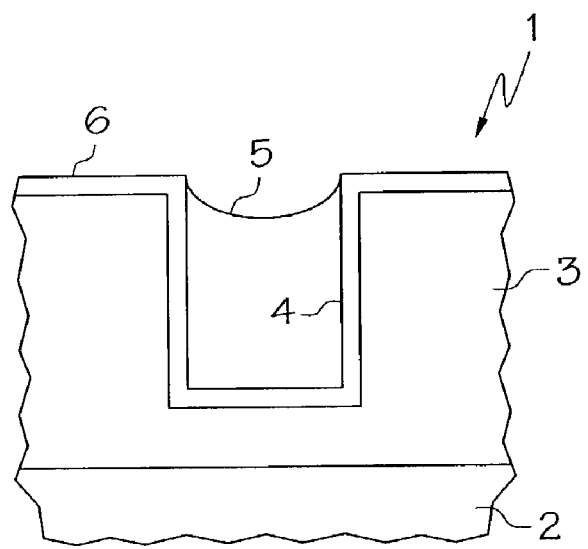
FIG. 1 is a diagrammatic view of a cross section of a semiconductor wafer having a copper metal layer removed to the level of an underlying barrier film of tantalum, and trenches imbedded with copper metal providing circuit interconnects.

Three opportunities are provided for dished metal redevelopment by depositing metal onto dished metal in dished trenches of a wafer to replace metal that has been removed from the dished trenches by a polishing operation.

(1). One opportunity for dished metal redevelopment by depositing metal onto dished trenches is presented by a wafer that has a polished and planarized surface of an ILD, and dished metal in trenches of the ILD. Such a wafer would benefit by having metal deposited onto the dished metal, which would raise the level of the metal in the trenches and minimize dishing. According to an embodiment of the invention, a metal deposition operation is performed on such a wafer, while at the same time, polishing the wafer with a reduced polishing pressure, to deposit metal onto the dished metal in the trenches, which replaces metal that has been removed from the trenches by a previous CMP polishing operation, and to raise the level of the plated metal in the trenches to a relative peak in the topology of the wafer. The relative peak is removed and planarized by polishing with the reduced polishing pressure. Experiments have been conducted, and are described hereafter.

(2). A second opportunity for dished metal redevelopment by depositing metal onto trenches is presented by a wafer that has a top layer of a metal, such as, copper, covering an underlying barrier film, and the wafer needs CMP polishing to remove the top layer of copper metal from the underlying barrier film, and to polish the surface of the barrier film to a planar surface. According to the invention, a CMP polishing operation is performed on a wafer for a time period sufficient to remove copper metal from an underlying barrier film on an ILD, which further causes metal dishing in trenches in the ILD, and, further, the polishing operation is continued with a reduced polishing pressure and in concert with a metal deposition solution, which deposits metal onto dished trenches in the ILD, and which polishes the wafer at such reduced polishing pressure to remove metal that becomes deposited on the barrier film, and which exposes the surface of the barrier film.

(3). A third opportunity for dished metal redevelopment by depositing metal onto trenches is presented by a wafer that has a barrier film covering an underlying ILD, and that has dished metal in trenches in the ILD. The wafer needs CMP polishing to remove the barrier film from the ILD, and to polish the ILD to a planar surface. According to the invention, a CMP polishing operation is performed to remove a barrier film from the underlying ILD and to polish the ILD to a planar surface. According to the invention, a CMP polishing operation is performed with a pH basic polishing fluid to remove a barrier film from an underlying ILD, and to polish a surface of the ILD to a planar surface, and the polishing fluid is a pH basic metal deposition solution which deposits metal onto dished metal in dished trenches in the ILD. Metal is deposited onto dished metal by the metal deposition solution at the same time that CMP polishing occurs to cause dishing. The dishing that would be caused by the CMP polishing is minimized. Experiments have been conducted, and are described hereafter.

FIG. 1, discloses a first opportunity, during manufacture of a wafer for providing a system for dished metal redevelopment by depositing metal onto dished metal in dished trenches. FIG. 1 discloses, a portion of a test wafer 1 comprising, a silicon substrate 2 and a layer of an ILD 3, for example, TEOS, having therein, one of multiple trenches 4 in which metal 5 is contained to provide a circuit interconnect. Further, the wafer 1 comprises, a barrier film 6, for example, of tantalum covering the ILD 3.

The wafer 1 disclosed in FIG. 1 was subjected to a previous CMP polishing operation that was intended to polish the barrier film 6 to a planar surface, and to polish the metal 5 in the trench 4 to the same height as that of the barrier film 6. However, as further disclosed by FIG. 1, a condition known as dishing has resulted from some of the concave dished metal 5 in the dished trench 4 being removed during polishing, which causes the dished metal 5 in the dished trench 4. Dishing is undesirable for adversely affecting the critical dimensions of the circuit interconnects, and for causing variations in the planarity of the wafer 1. Accordingly, there exists a need for dished metal redevelopment, which minimizes metal dishing.

Figure 2:
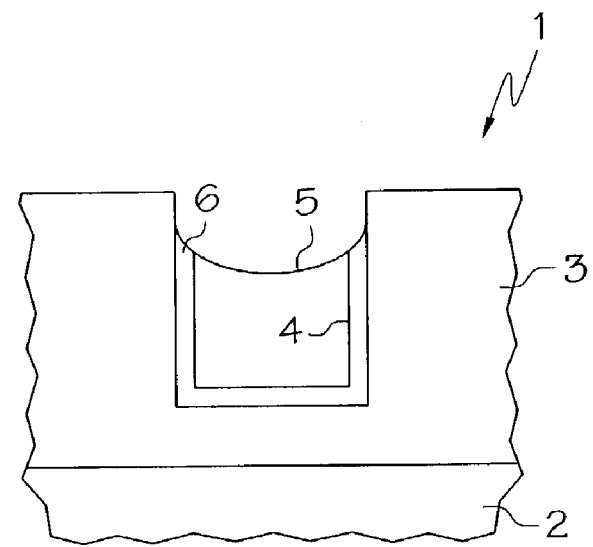
FIG. 2 is a diagrammatic view, similar to FIG. 1, disclosing a semiconductor test wafer having a having a layer of ILD with a polished surface, and dished copper metal in a dished trench in the ILD, which may be $SiO_2$, TEOS or a low K dielectric.

FIG. 2 discloses a second opportunity, during manufacture of a wafer, for providing a system for dished metal redevelopment by depositing metal onto dished metal in dished trenches. FIG. 2 discloses, a portion of a test wafer 1 comprising, a silicon substrate 2 and a layer of an ILD 3, for example, TEOS, having therein, one of multiple trenches 4 in which metal 5 is imbedded to provide a circuit interconnect. Further, the wafer comprises, a barrier film 6 between the ILD 3 and dished metal 5 in the dished trench 4. The ILD 3 has been polished with a planar surface, which has removed a barrier layer from the underlying ILD 3.

The invention has resulted from a series of experiments, described hereafter, discloses a third opportunity, during manufacture of a wafer, for providing a system for depositing metal onto dished metal in dished trenches.

Experiment 1 Using McDermit Hyspec 2

Experiment 1 was conducted to determine whether a known plating solution would deposit copper metal onto dished metal in dished trenches of a test wafer. A test wafer was provided, as having a top layer of copper removed by CMP polishing, and a barrier film of tantalum nitride removed by CMP polishing to the level of an ILD of TEOS. Dished trenches in the ILD contained dished copper metal.

The experiment was conducted by immersing the test wafer in a metal deposition solution at room temperature, according to which, a plating solution, adjusted to pH basic, was applied to the test wafer. The plating solution is commercially available from Shipley Chemical Corporation, and known as, McDermit Hyspec 2, of the Nanoplating 2000 Series. Sugar was added as a slow reacting, reducing agent. The results of the experiment were unsuccessful in depositing a sufficient thickness of metal in the trenches within a time frame of approximately three minutes.

Experiment 2 Using a Known Plating Solution

Experiment 2 was conducted to determine whether a known plating solution would deposit copper metal onto dished metal in dished trenches of a test wafer, using a known electroless copper plating solution, as described in U.S. Pat. No. 5,965,211. The test wafer was similar to the test wafer, as provided in Experiment 1.

The experiment was conducted by immersing a test wafer in the solution, adjusted to pH basic, for an observed time period. Thereafter, the test wafer was cleaned in deionized water.

The experiment was successful, in that the known electroless copper plating solution successfully deposited an acceptable thickness of copper in dished trenches of a test wafer within a few minutes duration.

Experiment 3 Using a Known Plating Solution

Experiment 3 was conducted to determine whether a known plating solution would deposit copper metal onto dished metal in dished trenches of a test wafer, using a known electroless copper plating solution, as described in, *Metal Finishing Guidebook*. The test wafer was similar to the test wafer, as provided in Experiment 1.

The experiment was conducted by immersing a test wafer in the solution, adjusted to pH basic, for an observed time period. Thereafter, the test wafer was cleaned in deionized water.

The experiment was successful, in that the known electroless copper plating solution successfully deposited an acceptable thickness of copper in dished trenches of a test wafer within a few minutes duration.

Experiment 4

Experiment 4 refers to a series of experiments that were conducted to determine whether different metal deposition solutions would deposit copper metal onto dished metal in dished trenches of a test wafer. In addition, the experiments were conducted to determine whether or not any of the tested metal deposition solutions is suitable for use as a slurry, or polishing fluid, in a CMP polishing operation to remove a barrier layer of tantalum and polish the underlying ILD with a planar polished surface. Further, at least one of the experiments was conducted to use a metal deposition solution as a slurry, or polishing fluid, in a CMP polishing system that operated to remove a barrier layer of tantalum, and to polish the underlying ILD with a planar polished surface.

Each test wafer was similar to the test wafer, as provided in Experiment 1. The series of experiments used different metal deposition solutions, RD-1 through RD34, as described in each of: Table 1, Table 2 and Table 3. These Tables are incorporated in the present description as an Appendix of the present description.

Table 1

Table 1 has three columns for categorizing rows of data entered in the Table 1. Column one of Table 1 is named, "Solution" for categorizing data entries by different metal deposition solutions that are identified as RD-1 through RD 36, as entered in column one of Table 1. The second column is named "Test subject" for categorizing data entries according to remarks pertaining to the constituents of the solutions. The third column is named "Observation" for categorizing data entries according to the observed results that occurred when test wafers were exposed to, and reacted with, the solutions.

The data entries corresponding to metal deposition solutions RD 1–RD5 in Table 1, pertain to different solutions that were formulated with combined constituents: $CuSO_4$, $NH_4$, Cl and sugar as a leveler, instead of formaldehyde as a reducing agent, and an adjusted pH>9, and/or an adjusted pH>11, as adjusted with KOH. As recorded in column three, the pH was observed to drift, or the solution changed color or precipitates were observed. Accordingly, the solutions RD1–RD5 were unsatisfactory in depositing metal in dished trenches of test wafers.

The data entries corresponding to metal deposition solutions RD-6 and RD-7 in Table 1, pertain to experiments wherein, different electroless plating solutions were formulated, with a reducing agent in the Loin of fonnaldehyde. The data entries indicate that solutions RD-6 and RD-7 were unsatisfactory in depositing metal in dished trenches of test wafers.

The data entries corresponding to metal deposition solutions RD-8 through RD-36, all pertain to solutions using formaldehyde and Potassium Ferrocyanide, as action initiators and as accellerators. Each of the solutions RD-8 through RD-36 used a metal deposition solution, for example, an electroless copper plating solution having combinations of constituent chemical parts that varied in combination and in relative concentrations. The constituent parts were selected from the constituent parts that comprised:

(1) Ethanolamine and Ethanolamine ACS reagent,
(2) Tri-ethanolamine,
(3) Formaldehyde and Formaldehyde sodium bisulfate, as reducers,
(4) $NH_4Cl$, Ammonium Chloride as a leveler,
(5) Ethylene-diamine-tetra-acetic acid (EDTA) as a complexing agent,
(6) D-iso-ascorbic acid (IAA) as a reducer,
(7) Nitrilo-tri-acetic acid,
(8) Isophthalic acid,
(9) 2,2'-Dipyridyl,
(10) Potassium ferrocyanide,
(11) Citric acid (CA) as a complexing agent,
(12) Copper sulfate pentahydrate (Cu $SO_4$), and
(13) CaH2.

Other such constituent parts comprised:

(1) Copper chloride,
(2) Ammonium citrate,
(3) Tartaric acid,
(4) Potassium ferrocyanide trihydrate,
(5) 2-Mercaptobenzothiazole (MBT),
(6) Sodium chloride,
(7) Potassium chloride,
(8) Phthalic acid, and
(9) Polyetheylene glycol.

The experiments were conducted at room temperature. In each solution, pH was adjusted with Potassium hydroxide to a pH within a range 11.30 to 12.60. The adjusted pH>9 was found to be required for an acceptable metal deposition rate of sufficient rapidity, to obtain, for example, 500 A° thickness of deposited metal in 5 minutes. An adjusted pH>11 increases the acceptable metal deposition rate.

The experiments indicate that an acceptable metal deposition rate onto dished trenches is accomplished by a solution having the chemical constituent parts; Potassium ferrocyanide, Copper sulfate or Copper chloride providing a source of copper ions, Ammonium citrate or $NH_3$ ETDA and a pH>9 and when polishing tantalum, a preferred pH>11.

Table 2

Table 2 in the Appendix, contains additional data entries corresponding to metal deposition solutions RD-8 through RD-36. Table 2 has three columns for categorizing rows of data entered in the Table 2.

Column one of Table 2 (and part of Column two) is named, "Slurry" for categorizing data entries by different metal deposition solutions that are identified as RD-1 through RD 36, as entered in column one of Table 1. The term, "Slurry" refers to a polishing fluid that is used in a CMP polishing system. The experiments were conducted to determine whether or not a metal deposition solution is suitable as a slurry, or polishing fluid, in a CMP polishing system.

An upper part of Column two of Table 2 is named "Total" to indicate the total grams "(g)" of different solutions that were used to deposit copper metal. Columns three through sixteen identify the constituent chemical parts of such different solutions, measured in grams "(g)"; and the percentages "(%)" in columns three through sixteen represent the concentrations, or purities, of the constituent chemical parts.

Further, Columns three through sixteen in a lower part of Table 2, below the grams "(g)" in columns three through sixteen, the percentages by weight percent of the constituent chemical parts are indicated. Column seventeen in the lower part of Table 2 is named "Final pH" to indicate the adjusted pH of the solutions, adjusted with KOH. Column eighteen is named "actual pH" to indicate the pH of the solutions prior to the pH being adjusted.

The adjusted pH>9 was found to be required for an acceptable metal deposition rate of sufficient rapidity, to obtain, for example, 500 A° thickness of deposited metal in 5 minutes. An adjusted pH>11 increases the acceptable metal deposition rate.

Further, a lower part of Column nineteen, Table 2, is named "Observation," for categorizing data entries according to the observed results that occurred when test wafers were exposed to, and reacted with, the solutions.

Table 3

Table 3, Appendix, records measurements of metal deposits on the surface of a test wafer having metal deposited by Solutions RD8 through RD 36. Column one, named "RD-formula" identifies the metal plating solutions RD8 through RD36, as further identified in Table 1 and Table 2. The measurements were performed by a Vecco profilometer, commercially available from the Veeco company.

Column one of Table 3, records respective plating solutions RD-08 through RD-30. Column two, of Table 3, named "Pre," records measurements in height of the metal in trenches, relative to the height of the TEOS providing an ILD; prior to exposure of the test wafer to the respective plating solutions RD-8 through RD-36, as recorded in Column one. Column two is divided into subcategories, "ASH," meaning Average Standard Height, and "TIR" meaning Total Indicated Result from the lowest measured height to the highest measured height, which was measured from a reference plane referenced at zero. The lowest measured height, in the "Pre" category of test measurements, corresponds to the depth of dished metal in the trenches, of test wafers prior to exposure to respective plating solutions. The highest measured height corresponds to the height of TEOS providing an ILD of the test wafers prior to exposure to respective plating solutions.

Column three of Table 3, named "Post," records measurements in height of the metal in trenches, relative to the height of the TEOS providing an ILD; subsequent to exposure of the test wafer to the respective plating solutions RD-8 through RD-36. Column 3 is divided into subcategories, "ASH," meaning Average Standard Height, and "TIR" meaning Total Indicated Result from the lowest measured height to the highest measured height, measured from a reference plane referenced at zero.

Column 4, of Table 3, named "Delta Ash" records measurements of the differences in "Ash" of metal in trenches of the test wafers, due to, either subtractive etching or additive deposition, of metal in trenches of the test wafers, caused by exposure of the test wafers to the respective solutions RD-08 through RD-36. Some of the measurements are negative, as indicated by respective minus signs, which indicate that etching, instead of additive deposition, was observed. The measurements in Column 4, Table 3, that are positive, as indicated without minus signs, indicate that metal was successfully deposited on the metal in the trenches.

Thus, Table 3 indicates that some of the solutions RD-08 through RD-36 were successful in depositing copper metal onto metal in trenches of the test wafers, and particularly, in depositing metal at an acceptable deposition rate that is equal to or greater than 100 A° per minute for an elapsed time of five minutes.

Figure 3:
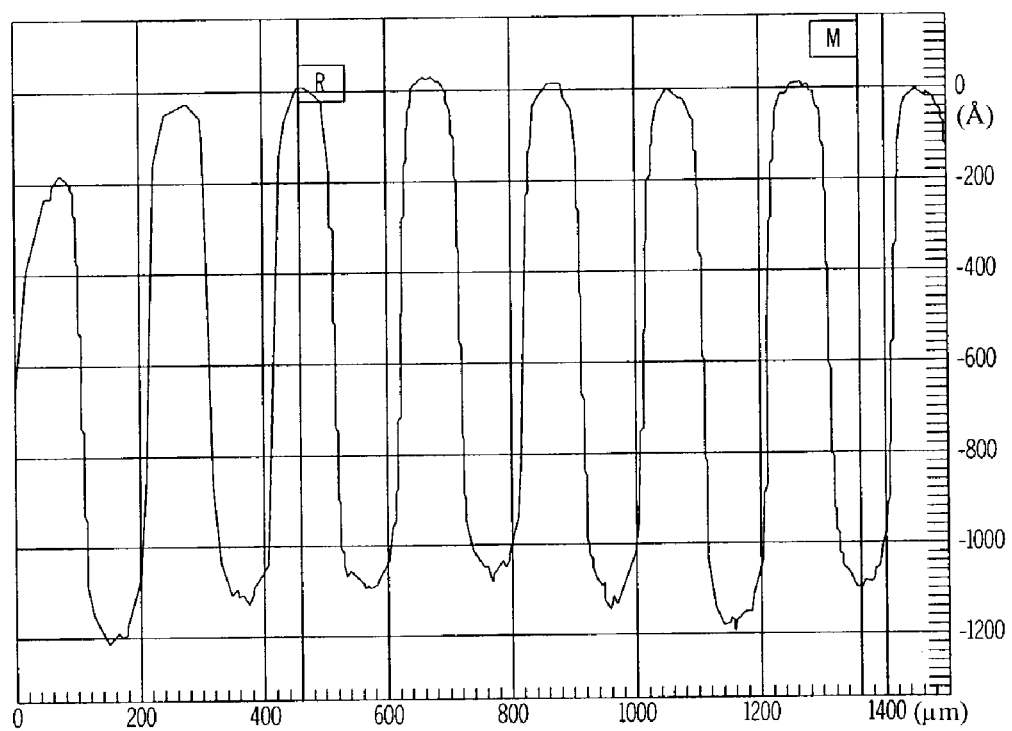
FIG. 3 is a graph disclosing measurements of a surface height profile of a test wafer prior to deposition of metal onto dished metal in dished trenches.

FIG. 3 graphically records measurements representing differences in the height of a test wafer having a number of dished trenches that are disposed between two reference points "R" and "M" spaced apart on the surface of the test wafer. The measurements are further represented, as disclosed by FIG. 4, in a spreadsheet. The measurements are further represented, as recorded in Table 3, by the "Pre" data corresponding to the solution RD-30. Additional graphs exist for other metal solutions. For purposes of description herein, such additional graphs are not disclosed herein.

Figure 5:
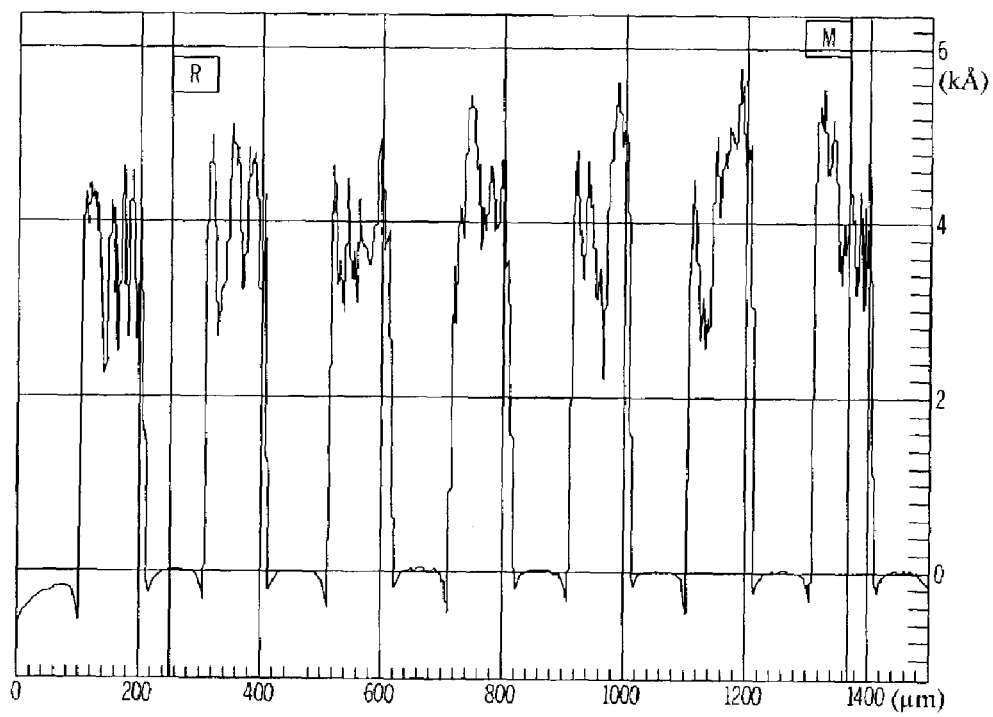
FIG. 5 is a graph disclosing measurements of a surface height profile of a test wafer with copper metal deposited onto dished metal in dished trenches.

FIG. 5 graphically records measurements representing differences in the height of the test wafer subsequent to the test wafer having been exposed to the metal deposition solution RD-30, as disclosed by Tables 1, 2 and 3. The measurements are further represented, as disclosed by FIG. 6, in a spreadsheet. The measurements are further represented, as recorded in Table 3, by the "Post" data corresponding to the solution RD-30. Additional graphs exist for other metal solutions. For purposes of description herein, such additional graphs are not disclosed herein.

Previous to conducting the experiment, the "Pre" data is depicted in the graph, FIG. 3, which discloses the ILD surface being measured as peaks in the graph, and which further discloses the dished metal in trenches being measured as valleys in the graph. The dished metal was below the level of the ILD. Following immersion of the test wafer in the solution RD-30, copper metal was deposited on the dished metal at an acceptable deposition rate. The "Post" data is depicted in the graph, FIG. 5, which discloses the ILD surface being measured as valleys in the graph, and which further discloses the deposited metal onto the trenches having a thickness that extends above the height of the ILD. FIG. 5 graphically indicates that copper metal has deposited on the dished metal in dished trenches of a test wafer. Accordingly, Table 3 provides a notation "Re-dep" as an indication that solution RD-30 provides an acceptable deposition of metal. Each of the other metal deposition solutions that provides an acceptable deposition is indicated with a similar notation "Re-dep" in Table 3.

The invention resides in using a metal deposition solution to deposit metal onto dished metal in dished trenches, and further, using such a solution as a polishing fluid for a CMP polishing operation to polish a wafer to a polished planar surface. For example, any of the solutions indicated with the notation "Re-dep" would be candidates for use as such a polishing fluid. According to the invention, metal dishing is minimized by providing a CMP polishing system that deposits metal onto dished metal in dished trenches.

With reference to FIG. 2, an opportunity to deposit copper metal during a polishing operation will now be discussed. For example, with reference to FIG. 2, A CMP polishing operation operates to remove a top layer of tantalum, barrier film, from the underlying ILD, TEOS using a relatively high polishing pressure in the presence of a polishing fluid, which removes the barrier film, and exposes the ILD and leaves dished metal in each dished trench. The CMP polishing operation is continued by polishing with a reduced polishing pressure in the presence of a metal deposition solution, such as a metal deposition solution, as appearing in Tables 1 and 2, to deposit metal onto dished metal in each dished trench, while polishing at a reduced polishing pressure polishes the surface of the deposited copper metal. The deposited metal will replace the metal removed by polishing with the relatively higher polishing pressure. Further, the deposited metal will be polished by the relatively lower polishing pressure in the presence of the metal deposition solution being used as the polishing fluid. Metal deposition is performed during CMP polishing with a reduced polishing pressure, while providing a metal deposition solution, which deposits metal onto the metal in the dished trench. The trench will have a metal deposit with a slightly dished surface caused by polishing during deposition. Accordingly, metal is deposited in the trench to replace metal that has been removed by polishing. The deposited metal in the trench has only a slightly dished surface that results from polishing simultaneously occurring with deposition of the metal. The deposited metal in each trench ensures that sufficient metal is present in the trench to provide a circuit interconnect that meets critical dimensional requirements, and that avoids a localized defect in the wafer due to excessive dishing.

Figure 7:
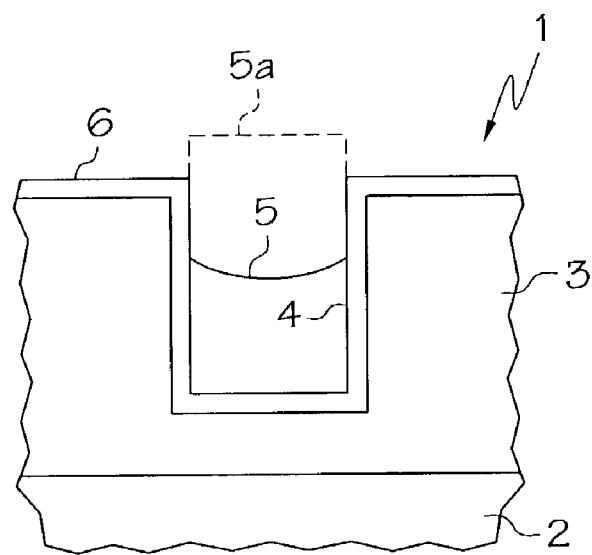
FIG. 7 is a diagrammatic view, similar to FIG. 1, disclosing a test wafer with a barrier film of tantalum covering a layer of ILD, and further disclosing a dished trench onto which is diagrammatically shown a deposit of copper metal applied by an electroless plating solution being used as a polishing fluid in a CMP polishing operation to remove the tantalum.

With reference to FIG. 7, a further opportunity to deposit copper metal during another polishing operation will now be discussed. For example, with reference to FIG. 7, A CMP polishing operation operates to remove a top layer of copper metal from the underlying barrier film 6 using relatively high polishing pressure in the presence of a known copper removing, polishing fluid, which removes the copper metal, and exposes the barrier film 6, and leaves dished metal 5 in each dished trench 4. The polishing pressure used in a CMP polishing operation can be adjusted to be in excess of seven pounds per square inch, which is used, for example, to remove a layer of copper metal from a wafer 1. The polishing pressure used in a CMP polishing operation can be adjusted to be between six pounds per square inch and three pounds per square inch, which is used, for example, to remove a layer 6 of tantalum metal from a wafer 1.

According to the invention, the CMP polishing operation is continued by polishing with a reduced polishing pressure, adjusted to be less than three pounds per square inch, in the presence of a metal deposition solution, such as a metal deposition solution, as appearing in Tables 1 and 2, to deposit metal, indicated by a phantom outline 5A, onto dished metal 5 in each dished trench 4, while polishing at a reduced polishing pressure polishes the surface of the deposited copper metal 5a. The solution selectively deposits copper metal 5a onto dished copper 5, rather than onto the tantalum 6. The deposited metal 5a will replace the metal 5 removed by polishing with the relatively higher polishing pressure, which results in dished metal redevelopment. Further, the deposited metal 5 will be polished by the relatively lower polishing pressure in the presence of the metal deposition solution being used as the polishing fluid.

Metal deposition is performed during CMP polishing with a reduced polishing pressure, while providing a metal deposition solution, which deposits metal 5a onto the dished metal 5 in the dished trench 4. The trench 4 will have a metal 5 with a slightly dished surface caused by polishing during deposition. Accordingly, metal 5a is deposited in the trench to replace metal 5 that has been removed by polishing. The deposited metal 5a onto the trench 4 has only a slightly dished surface that results from polishing simultaneously with deposition of the metal 5a. The deposited metal 5a onto each trench 4 ensures that sufficient metal is present in the trench 4 to provide a circuit interconnect that meets critical dimensional requirements, and that avoids a localized defect in the wafer 1 due to excessive dishing.

With reference to FIG. 7, another opportunity to deposit copper metal during a polishing operation will now be discussed. By way of example, the thickness of the dished metal 5 in each trench 4 is at least 600 A° minimum, which is the minimum thickness for a circuit interconnect that meets critical dimensions. A further CMP polishing operation is required to remove the tantalum, barrier film 6, to expose the underlying ILD 3, and to polish the ILD 3 with a planar polished surface. However, further dishing of the dished metal 5 in each trench 4, as caused by the further CPM polishing operation would be undesired.

According to the invention, a CMP polishing operation operates to remove a top layer of tantalum, barrier film 6, from the underlying ILD 3, TEOS, using a relatively higher polishing pressure in the presence of a polishing fluid, which removes the barrier film 6, exposing the underlying ILD 6 and leaving dished metal 5 in each dished trench 4. The polishing fluid is a metal deposition solution, such as disclosed in Tables 1, 2 and 3, to deposit metal 5a onto the dished metal 5 in each dished trench 4. The solution selectively deposits copper metal 5a onto dished copper metal 5 in each dished trench 4. The metal deposition solution has an adjusted pH>9 to ensure an acceptable metal deposition rate. In addition the solution, by having a relatively high pH will ensure chemical dissolution of the barrier layer 6, the barrier layer being removed by a combination of mechanical removal by polishing and chemical removal by dissolution. The polishing fluid contains abrasive colloidal silica of 15% by weight proportion, for enhancing the time based rates of removal and polishing.

Figure 8:
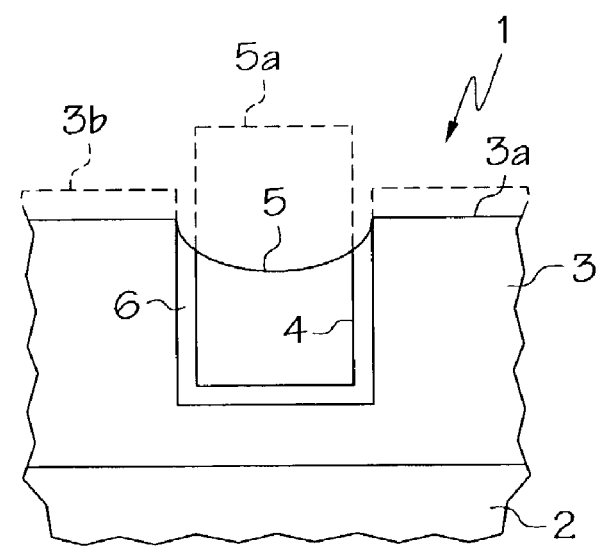
FIG. 8 is a diagrammatic view, similar to FIG. 2, disclosing a test wafer having a layer of ILD with a polished surface, following a CMP polishing operation to remove a barrier layer of tantalum, and using a polishing fluid comprising a metal deposition solution that minimizes dishing of metal in a dished trench in the ILD.

Polishing with a relatively higher polishing pressure, 3–7 pounds per square inch, removes the top layer of tantalum at a relatively rapid rate, while copper metal 5a is being deposited in the trench 4, to expose the underlying ILD 3. Polishing continues with a reduced polishing pressure to polish the underlying ILD 3 to a planar polished surface. FIG. 8 discloses a wafer 1 that has been polished sufficiently to remove all of the tantalum, barrier film 6, exposing a polished surface 3a of the underlying ILD 3.

FIG. 8 diagrammatically shows that a potential thickness of deposited copper metal 5a, in the absence of polishing, would extend the metal 5 in the trench 4 to a height above the height of the ILD 3. Such an occurrence is further disclosed by FIG. 6 that discloses measurements of metal 5a in trenches 4 extended to a height above the height of the TEOS, barrier film 6, following metal deposition according to experiment RD-30. However, the polishing operation removes the deposited copper metal 5a, such that, as shown in FIG. 8, the polishing operation has removed all deposited copper metal 5a in its entirety, which leaves the dished metal 5 in each trench 4 with the required thickness of at least 600 A° minimum, which is the minimum thickness for a circuit interconnect that meets critical dimensions. According to an advantage of the invention, complete removal of the deposited metal 5a by CMP polishing, eliminates the deposited metal 5a together with all defects in the deposited metal 5a, because of excessively large grain boundaries, or because of interruptions in the deposit, or because of copper complexing ions in the deposited copper metal.

Another advantage of removing all of the deposited metal 5a during CMP polishing of the wafer 1 shown in FIGS. 7 and 8, is that dishing of the metal 5 in the trench 4, as shown in FIG. 8, remains unchanged from that shown in FIG. 7, without the dishing being increased by the polishing operation that removes the tantalum barrier film 6. Accordingly, dishing is minimized by the polishing operation, according to the invention. For example, FIG. 8 diagrammatically shows, in phantom outline 5a, the potential thickness of deposited copper metal 5a that would extend the height of metal 5 in the trench 4, in the absence of polishing. However, the polishing operation has removed all of the metal 5a deposited by the metal deposition solution. By way of example, the polishing operation is performed with a reduced polishing pressure for an elapsed time of five minutes. Such polishing operation uses the metal deposition solution RD-36, as identified in each of Tables 1, 2 and 3, as a polishing fluid having an adjusted pH>11, and specifically pH=12. Further, the solution is used as a polishing fluid for CMP polishing, and has abrasive colloidal silica 15% by weight proportion of the constituent parts of the solution.

The columns of Table 4 in the Appendix, identify the test wafer, the down force DF, the pressure BP, the Flow rate of the polishing fluid (metal deposition solution and abrasive particles), the speed of the Platen mounting the test wafer thereon, the speed of the Carrier on which the Polish Pad is mounted, the polishing time Pol. Time, the Slurry composition RD-36, and the type of Polish Pad used for polishing. The thickness of deposited metal 5a would be approximately 500 A° in the absence of polishing. However the polishing operation with a reduced polishing pressure has removed the deposited metal 5a in its entirety, without increasing the depth of the dished metal 5 that was previously in the trench 4. The polishing operation prevents increased dishing of the dished metal 5 in the trench 4 to provide a circuit interconnect that meets critical dimensional requirements. Further, the polishing operation avoids a localized defect in the wafer 1 due to excessive dishing. Further, FIG. 8 diagrammatically shows, in phantom outline, the height 3b of the ILD 3 that is removed by polishing to a planar polished surface 3a. By way of example, 100 A° of the TEOS, ILD 3, is removed by polishing to a planar polished surface 3a.

An Appendix appears on seven following pages herein.

Although preferred embodiments of the invention have been disclosed, other embodiments and modifications are intended to be covered by the spirit and scope of the appended claims.

Appendix - Table 1

| Solution | Test subject | Observation |
|---|---|---|
| RD-1 | tartaric and vanillin | pH 9.3 no re-dep |
| RD-2 | tartaric salicylaldehyde | pH drift from 10 to 8.9, no re-dep |
| RD-3 | ammonium citrate and vanillin | pH 11 etched Cu 200–300 A, NH3 from ammonium citrate etched |
| RD-4 | Citric and vanillin | pH 11, No etch no-redep, solution change color at pH 5.5–6 to yellowish color |
| RD-5 | Citric and vanillin | No re-dep:, pH drifted from 11 to 7.7 |
| RD-6 | Formaldehyde, EDTA, potassium sodium tartrate | pH 12: overnight soak showed corrosion with no re-dep |
| RD-7 | Formaldehyde, edta, sugar malic acid | initial pH at 9 solution percipitated with malic acid solution re-desolved: 600 A etched overnight |
| RD-8 | Formaldehyde, edta tartaric NH4Cl sugar pH 9.5 | re-dep overnight |
| RD-9 | ethanolamine. Formaldehyde NH4Cl, ammonium citrate Potassium ferrocyanide, pH 11.3 | Re-dep 11,200A with 10 min soak photo showed dark material on top of Cu, bonding is weak |
| RD-10 | RD-9 with NaCl (minimize NH4) | Re-dep 100A with 5 min soak |
| RD-11 | RD-10 with no K ferrocyanide | Etched 100 A within 5 min at pH 11.3 |
| RD-12 | triethanolamine, 2,2'diphridyl | bluish solution at pH 7.2–7.5 with percipitate after adjusting pH to 12.6 solution re-desolved |
| RD-13 | RD-12 with IAA | greenish solution with percipitate at pH 7.2–7.5. After adjusting pH to 12.6 solution re-desolved but small amount of black solid at the bottom |
| RD-14 | all ingrediaent | Brownish percipitate settle Re-dep test suspended |
| RD-15 | RD-14 minus IAA | Etched 10 A within 5 min with no re-dep, solution stay same light blue |
| RD-16 | RD-15minus, Nitrilotriacetic acid | No re-dep or etch, solution stay same blue color |
| RD-17 | RD-16 minus edta | No re-dep or etch, solution stay same blue color |
| RD-18 | rd-17 minus 2,2'dipyridyl | spots of re-dep (14K A) within 5 min un-even "spot" deposition |
| RD-19 | CaH2 | Reacted violently when added to pH 12 solution no re-dep |
| RD-20 | CA, dipyridyl | no re-dep |
| RD-21 | Ca, IAA | Precipitated brown FeOH |
| RD-22 | Triethanolamine, CA | spots of re-dep (44K A) within 5 min |
| RD-23 | Triethanolamine, IAA, dipyridyl, CA | Precipitated brown FeOH |
| CA | Clean surface with | 8000 re-dep (dark granular structure) |
| RD-09 | 1.5% CA solution | Ammonium citrate used not CA |
| CA | Clean surface with | 300 re-dep spotty |
| RD-10 | 1.5% CA solution | CA used |
| CA | Clean surface with | 500 re-dep spotty |
| RD-18 | 1.5% CA solution | CA used |
| CA | Clean surface with | 300 re-dep spotty |
| RD-22 | 1.5% CA solution | CA used |
| RD-23 | IAA | Precipitated brown FeOH |
| RD-24 | Low potassium ferrocyanide | Redep 2921A 5 min |
| RD-25 | low ammonium citrate | Redep 1051A 5 min |
| RD-26 | Isophthalic acid | Redep 4168A 5 min |
| RD-27 | sodium sulfite | Etch 102A 5 min |
| RD 28 | mercaptoacetic acid | Precipitated brown FeOH |
| RD 29 | Higher isophthalic .25% | Partial re-dep 8950A |
| RD 30 | Higher isophthalic .5% | Re-dep 4721 A |
| RD 31 | Higher isophthalic 1% | Re-dep 4379 A |
| RD-32 | lower sodium sulfite .25% | Isolated spots |
| RD-33 | lower sodium sulfite .1% | Re-dep 14282 A |
| RD-34 | lower sodium sulfite .05% | Re-dep 5069 A |
| RD-35 | Larger batch with higher NaCl | Polish 1st step wafer with 3292 and 3285 than polish with RD35 on politex pad |
| RD-36 | RD-35 + 1501–50 1:1 volume mix | Polish 1st step wafer with RD35 with 1501–50 |

Appendix - Table 2

| Slurry | Total (g) | 99% Ethanol amine (basic) (g) | 99% Triethanol amine (basic) (g) | 98% Triethan (g) | Formaldehyde (reducer) (g) | 37% Formald (g) | NH4Cl (leveler) (g) | 98.0% NH4CL(le (complex) (g) | EDTA (complex) (g) | 100.0% EDTA (d (g) | IAA (reducer) (g) | 98.0% IAA (red (g) | Nitrilotri-acetic acid (g) | 99.0% Nitrilotria (g) | Isophthalic acid (g) | 99.0% Isophth (g) | 2,2'-Dipyridyl (g) | 99.0% 2,2'-Dipyr (g) | Potassium-ferro-cyanide (g) | 99.0% Potasium (g) | CA (complexing) (g) | 99.5% CA (cor (g) | CuSO4 (g) | 99% CuSO4 (g) | CaH2 (g) | 99% CaH2 (g) | other | DIW (g) | B-part (g) | A-Part (g) | A-part (conc.) |
|---|---|---|---|---|---|---|---|---|---|---|---|---|---|---|---|---|---|---|---|---|---|---|---|---|---|---|---|---|---|---|---|
| RD-8 | 999 | | 0.00 | | 0.110 | 2.97 | | 1.02 | | 2.00 | | 0.00 | | 0.00 | | 0.00 | | 0.00 | | 0.00 | | 0.00 | | 1.01 | | 0.00 | | 992 | 999 | 0 | |
| RD-9 | 1000 | | 6.06 | | 0.185 | 5.00 | | 0.10 | | 0.00 | | 0.00 | | 0.00 | | 0.00 | | 0.00 | | 0.51 | | 1.01 | | 1.01 | | 0.00 | | 986 | 1000 | 0 | 30.0 |
| RD-10 | 1000 | | 5.05 | | 0.150 | 4.05 | | 0.10 | | 0.00 | | 0.00 | | 0.00 | | 0.00 | | 0.00 | | 0.00 | | 0.51 | | 1.01 | | 1.01 | | 0.00 | | 988 | 1000 | 0 | 30.0 |
| RD-11 | 1000 | | 5.05 | | 0.150 | 4.05 | | 0.10 | | 0.00 | | 0.00 | | 0.00 | | 0.00 | | 0.00 | | 0.00 | | 0.00 | | 1.01 | | 1.01 | | 0.00 | | 989 | 1000 | 0 | 30.0 |
| RD-12 | 500 | | 0.00 | 0.76 | 0.150 | 2.03 | | 0.05 | | 0.00 | | 0.51 | | 0.00 | | 0.00 | | 0.13 | | 0.13 | | 0.00 | | 0.51 | | 0.00 | | 496 | 500 | 0 | 30.0 |
| RD-13 | 500 | | 0.00 | 0.76 | 0.150 | 2.03 | | 0.05 | | 0.25 | | 0.51 | | 0.00 | | 0.00 | | 0.13 | | 0.13 | | 0.00 | | 0.51 | | 0.00 | | 496 | 500 | 0 | 30.0 |
| RD-14 | 500 | | 2.53 | 0.00 | 0.150 | 2.03 | | 0.05 | | 0.25 | | 0.00 | | 0.51 | | 0.00 | | 0.00 | | 0.10 | | 0.25 | | 0.00 | | 0.51 | | 0.00 | | 493 | 500 | 0 | 30.0 |
| RD-15 | 500 | | 2.53 | 0.00 | 0.150 | 2.03 | | 0.05 | | 0.25 | | 0.00 | | 0.51 | | 0.00 | | 0.00 | | 0.05 | | 0.25 | | 0.00 | | 0.51 | | 0.00 | | 494 | 500 | 0 | 30.0 |
| RD-16 | 500 | | 2.53 | 0.00 | | 2.03 | | 0.05 | | 0.00 | | 0.00 | | 0.00 | | 0.00 | | 0.05 | | 0.25 | | 0.00 | | 0.51 | | 0.00 | | 494 | 500 | 0 | 30.0 |
| RD-17 | 500 | | 2.53 | 0.00 | | 2.03 | | 0.05 | | 0.00 | | 0.00 | | 0.00 | | 0.00 | | 0.05 | | 0.25 | | 0.00 | | 0.51 | | 0.00 | | 495 | 500 | 0 | 30.0 |
| RD-18 | 500 | | 2.53 | 0.00 | | 2.03 | | 0.05 | | 0.00 | | 0.00 | | 0.00 | | 0.00 | | 0.05 | | 0.25 | | 0.50 | | 0.51 | | 0.00 | | 495 | 500 | 0 | 30.0 |
| RD-19 | 500 | | 2.53 | 0.00 | | 2.03 | | 0.05 | | 0.00 | | 0.00 | | 0.00 | | 0.00 | | 0.00 | | 0.25 | | 0.50 | | 0.51 | | 0.51 | | 494 | 500 | 0 | 30.0 |
| RD-20 | 500 | | 2.53 | 0.00 | | 2.03 | | 0.05 | | 0.00 | | 0.00 | | 0.00 | | 0.00 | | 0.05 | | 0.25 | | 0.50 | | 0.51 | | 0.00 | | 494 | 500 | 0 | 30.0 |
| RD-21 | 500 | | 2.53 | 0.00 | | 2.03 | | 0.05 | | 0.00 | | 0.51 | | 0.00 | | 0.00 | | 0.00 | | 0.25 | | 0.50 | | 0.51 | | 0.00 | | -494 | 500 | 0 | 30.0 |
| RD-22 | 500 | | 2.53 | 0.51 | | 2.03 | | 0.05 | | 0.00 | | 0.00 | | 0.00 | | 0.00 | | 0.00 | | 0.25 | | 0.50 | | 0.51 | | 0.00 | | 494 | 500 | | |
| RD-23 | 500 | | 2.53 | 0.51 | | 2.03 | | 0.05 | | 0.00 | | 0.51 | | 0.00 | | 0.00 | | 0.05 | | 0.25 | | 0.50 | | 0.51 | | 0.00 | | 493 | 500 | 0 | 30.0 |

| Slurry | Ethanol-amine (basic) | Triethanol-amine (basic) | Formaldehyde (reducer) | NH4Cl (leveler) | EDTA (complex) | IAA (reducer) | Nitrilotri-acetic acid | Isophthalic acid | 2,2'-Dipyridyl | Potassium-ferro-cyanide | CA (complexing) | CuSO4 | CaH2 | other | Final pH | actual pH | Observation |
|---|---|---|---|---|---|---|---|---|---|---|---|---|---|---|---|---|---|
| RD-8 | 0.6 | | | | 0.2000 | | | | | | | 0.10 | | x | 12.20 | 9.5 | Tartaric 1 g sugar 5 g |
| RD-9 | 0.5 | | | | | | | | | 0.0500 | 0.1000 | 0.10 | | x | 11.30 | | Ammonium citrate not CA |
| RD-10 | 0.5 | | | | | | | | | 0.0500 | 0.1000 | 0.10 | | x | 11.30 | | NaCl |
| RD-11 | | | | | | | | | | | 0.1000 | 0.10 | | | 12.60 | | |
| RD-12 | | | | | | | | | 0.0250 | 0.0250 | | 0.10 | | | 12.60 | | |
| RD-13 | | 0.15 | | | | 0.1000 | | | 0.0250 | 0.0500 | | 0.10 | | | 12.00 | | |
| RD-14 | 0.5 | 0.15 | | | 0.05 | 0.1000 | 0.1000 | | 0.0200 | | | | | | | 12.2 | pH 8.8 prior to ph adjustment, color was clear at pH 8.8 turn slightly yellowish at pH 12, mixed color is brownish |
| RD-15 | 0.5 | | 0.150 | 0.010 | 0.05 | | 0.1000 | | 0.0100 | 0.0500 | | 0.10 | | | 12.00 | 12.2 | pH 9.2 prior to adjustment, yellow turn to light blue when CuSo4 added |

Appendix - Table 2 -continued

| Slurry | Total (g) | 99% Ethanol (g) | 98% Triethan (g) | 37% Formald (g) | 98.0% NaCL(lev (g) | 100.0% EDTA (d (g) | 98.0% IAA (red (g) | 99.0% sodium s (g) | 99.0% Isophth (g) | 2,2'-Dipyr (g) | 99.0% Postasium (g) | 99.5% NH4 cit (g) | 97% Mercapt (g) | 99% CuSO4 (g) | DIW (g) | B-part (g) | 30.0% part A (g) | A-Part (g) | A-part (conc.) | |
|---|---|---|---|---|---|---|---|---|---|---|---|---|---|---|---|---|---|---|---|---|
| RD-16 | 500 | | | | | | | | | 0.0100 | 0.0500 | | 0.10 | | | 12.00 | | 12.5 | | pH 9.4 prior to adjustment, yellow turn blue when CuSO4 added |
| RD-17 | 500 | | | | | | | | | 0.0100 | 0.0500 | | 0.10 | | | 12.00 | | 12.0 | | pH 9.4 prior to adjustment, yellow turn darker blue when CuSO4 added |
| RD-18 | 500 | | | | | | | | | 0.0100 | 0.0500 | | 0.10 | | | 12.00 | | 12.2 | | pH 9.5 prior to adjustment, yellow turn dark blue when CuSO4 added |
| RD-19 | 500 | | | | | | | | | 0.0100 | 0.0500 | 0.1000 | 0.10 | 0.10 | | 12.00 | | 9.2/12 | | violent reaction to H2O even at high pH |
| RD-20 | 500 | | | | | | | | | 0.0100 | 0.0500 | 0.1000 | 0.10 | | | 12.00 | | 9.2/12 | | precipitate FeOH brown color |
| RD-21 | 500 | 0.1 | | | | | | | | | 0.0500 | 0.1000 | 0.10 | | | 12.00 | | 8.8/12 | | |
| RD-22 | 500 | 0.1 | | | | | | | | | 0.0500 | 0.1000 | 0.10 | | | 12.00 | | 9.2/12 | | |
| RD-23 | 500 | | | | | | | | | 0.0100 | | | 0.10 | | | 12.00 | | 9.0/12 | | precipitate FeOH brown color |
| RD-24 | 500 | 3.03 | 0.00 | 2.50 | 0.05 | 0.00 | 0.00 | 0.00 | 0.00 | 0.00 | 0.10 | 0.50 | 0.00 | 0.52 | 494 | 500 | | 0 | 30.0 | |
| RD-25 | 500 | 3.03 | 0.00 | 2.50 | 0.05 | 0.00 | 0.00 | 0.00 | 0.00 | 0.00 | 0.25 | 0.25 | 0.00 | 0.52 | 494 | 500 | | 0 | 30.0 | |
| RD-26 | 500 | 3.03 | 0.00 | 2.50 | 0.05 | 0.00 | 0.00 | 0.00 | 0.51 | 0.00 | 0.25 | 0.50 | 0.00 | 0.52 | 493 | 500 | | 0 | 30.0 | |
| RD-27 | 500 | 3.03 | 0.00 | 2.50 | 0.05 | 0.00 | 0.00 | 2.53 | 0.00 | 0.00 | 0.25 | 0.50 | 0.00 | 0.52 | 491 | 500 | | 0 | 30.0 | |
| RD-28 | 500 | 3.03 | 0.00 | 2.50 | 0.05 | 0.00 | 0.00 | 0.00 | 1.01 | 0.00 | 0.25 | 0.50 | 2.58 | 0.52 | 490 | 500 | | 0 | 30.0 | |
| RD-29 | 500 | 3.03 | 0.00 | 2.50 | 0.05 | 0.00 | 0.00 | 0.00 | 0.00 | 0.00 | 0.25 | 0.50 | 0.00 | 0.52 | 494 | 500 | | 0 | 30.0 | |
| RD-30 | 500 | 3.03 | 0.00 | 2.50 | 0.05 | 0.00 | 0.00 | 0.00 | 0.00 | 0.00 | 0.25 | 0.50 | 0.00 | 0.52 | 494 | 500 | | 0 | 30.0 | |
| RD-31 | 500 | 3.03 | 0.00 | 2.50 | 0.05 | 0.00 | 0.00 | 0.00 | 0.00 | 0.00 | 0.25 | 0.50 | 0.00 | 0.52 | 494 | 500 | | 0 | 30.0 | |
| RD-32 | 500 | 3.03 | 0.00 | 2.50 | 0.05 | 0.00 | 0.00 | 0.00 | 0.00 | 0.00 | 0.25 | 0.50 | 0.00 | 0.52 | 494 | 500 | | 0 | 30.0 | |
| RD-33 | 500 | 3.03 | 0.00 | 2.50 | 0.05 | 0.00 | 0.00 | 0.00 | 0.00 | 0.00 | 0.25 | 0.50 | 0.00 | 0.52 | 494 | 500 | | 0 | 30.0 | |
| RD-34 | 500 | 3.03 | 0.00 | 2.50 | 0.05 | 0.00 | 0.00 | 0.00 | 0.00 | 0.00 | 0.25 | 0.50 | 0.00 | 0.52 | 494 | 500 | | 0 | 30.0 | |
| RD-35 | 4000 | 24.24 | 0.00 | 20.00 | 4.08 | 0.00 | 0.00 | 0.00 | 0.00 | 0.00 | 2.02 | 4.02 | 0.00 | 4.12 | 3946 | 4000 | | 0 | 30.0 | |
| RD-36 | 2000 | 12.12 | 0.00 | 10.00 | 2.04 | 0.00 | 0.00 | 0.00 | 0.00 | 0.00 | 1.01 | 2.01 | 0.00 | 2.06 | 973 | 1000 | 1000 | 1000 | 30.0 | |
| RD-37 | 500 | 0.00 | 0.00 | 2.50 | 0.51 | 0.00 | 0.00 | 0.00 | 2.53 | 0.00 | 0.25 | 0.50 | 0.00 | 0.52 | 494 | 500 | | 0 | 30.0 | |
| RD-38 | 500 | 0.00 | 0.00 | 2.50 | 0.51 | 0.00 | 0.00 | 0.00 | 2.53 | 0.13 | 0.25 | 0.50 | 0.00 | 0.52 | 494 | 500 | | 0 | 30.0 | |
| | 500 | 0.00 | 0.00 | 0.00 | 0.00 | 0.00 | 0.00 | 0.00 | 0.00 | 0.00 | 0.00 | 0.00 | 0.00 | 0.00 | 500 | 500 | | | 30.0 | |

Appendix - Table 2 -continued

| Slurry | Ethanol-amine (basic) | Triethanol-amine (basic) | Formal-dehyde (reducer) | NaCl (leveler) | EDTA (complex) | IAA (reducer) | sodium sulfite | Isophthalic acid | 2,2'-Dipyridyl | Potassium-ferro-cyanide | NH4 citrate | Mercapto-acetic acid | Cu-SO4 | other | Final pH | actual pH | Klebosol 1501-50 | Observation |
|---|---|---|---|---|---|---|---|---|---|---|---|---|---|---|---|---|---|---|
| RD-24 | 0.6 | | 0.185 | 0.010 | | | | | | 0.0190 | 0.1000 | | 0.10 | | 12.00 | 12.00 | | |
| RD-25 | 0.6 | | 0.185 | 0.010 | | | | | | 0.0500 | 0.0500 | | 0.10 | | 12.00 | 12.00 | | |
| RD-26 | 0.6 | | 0.185 | 0.010 | | | | 0.1000 | | 0.0500 | 0.1000 | | 0.10 | | 12.00 | 11.90 | | |
| RD-27 | 0.6 | | 0.185 | 0.010 | | | 0.5000 | | | 0.0500 | 0.1000 | | 0.10 | | 12.00 | 12.00 | | |
| RD-28 | 0.6 | | 0.185 | 0.010 | | | | 0.2000 | | 0.0500 | 0.1000 | | 0.10 | | 12.00 | 12.15 | | CuSo4 turn black at ph 8.8, desolved to clear at ph 12, formed light brown color FeOH after |
| RD-29 | 0.6 | | 0.185 | 0.010 | | | | | | 0.0500 | 0.1000 | | 0.10 | | 12.00 | 12.0 | | |
| RD-30 | 0.6 | | 0.185 | 0.010 | | | | | | 0.0500 | 0.1000 | | 0.10 | | 12.00 | 12.1 | | |
| RD-31 | 0.6 | | 0.185 | 0.010 | | | | | | 0.0500 | 0.1000 | | 0.10 | | 12.00 | 12.2 | | |
| RD-32 | 0.6 | | 0.185 | 0.010 | | | | | | 0.0500 | 0.1000 | | 0.10 | | 12.00 | 12.2 | | |
| RD-33 | 0.6 | | 0.185 | 0.010 | | | | | | 0.0500 | 0.1000 | | 0.10 | | 12.00 | 12.1 | | |
| RD-34 | 0.6 | | 0.185 | 0.010 | | | | | | 0.0500 | 0.1000 | 0.50 | 0.10 | | 12.00 | 12.0 | | |
| RD-35 | 0.6 | | 0.185 | 0.100 | | | | | | 0.0500 | 0.1000 | | 0.10 | | 12.00 | | | |
| RD-36 | 0.6 | | 0.185 | 0.100 | | | | | | 0.0500 | 0.1000 | | 0.10 | | 12.00 | | | |
| RD-37 | | | 0.185 | 0.010 | | | | 0.5000 | | 0.0500 | 0.1000 | | 0.10 | | 12.00 | | 15.0 | |
| RD-38 | | | 0.185 | 0.010 | | | | 0.5000 | 0.0250 | 0.0500 | 0.1000 | | 0.10 | | 12.00 | | | |

Adjust DI water pH with KOH to pH 10 then sdd chemical starting ethanolamine

Appendix - Table 3
Re-dep measurement Veeco

| RD-formular | Pre ASH | Pre TIR | Post ASH | Post TIR | DELTA ASH | |
|---|---|---|---|---|---|---|
| RD-08 | | | | | | |
| RD-09 | | | | | | |
| RD-10 | | | | | | |
| RD-11 | | | | | | |
| RD-12 | | | | | | |
| RD-13 | | | | | | |
| RD-14 | | | | | | |
| RD-15 | 697 | 735 | 727 | 772 | −30 | |
| RD-16 | 517 | 699 | 522 | 706 | −5 | |
| RD-17 | 1034 | 1228 | 1008 | 1253 | 26 | |
| RD-18 | 406 | 727 | 542 | −14727 | −136 | Cu spots |
| RD-19 | 1285 | 1376 | 1235 | 1363 | 50 | |
| RD-20 | 201 | 482 | 195 | 555 | 6 | |
| RD-22 | 124 | 354 | 1 | −44973 | 123 | Cu spots |
| CA RD-09 | 309 | 342 | −7970 | −10527 | 8279 | Re-dep |
| CA RD-10 | 291 | 461 | −32 | −1374 | 323 | Re-dep |
| CA RD-18 | 1305 | 1385 | 781 | 1515 | 524 | Re-dep |
| CA RD-22 | 1732 | 1783 | 1411 | 1715 | 321 | Re-dep |
| RD-24 | 1101 | 1192 | −1820 | 9354 | 2921 | Re-dep |
| RD-25 | 574 | 742 | −477 | 2960 | 1051 | Re-dep |
| RD-26 | 404 | 472 | −3764 | 5643 | 4168 | Re-dep |
| RD-27 | 79 | 197 | 181 | 248 | −102 | |
| RD-29 | 53 | 160 | −8897 | 11935 | 8950 | Re-dep slot 12 |
| RD-30 | 1091 | 1229 | −3630 | 6243 | 4721 | Re-dep slot 13 |
| RD-31 | 831 | 866 | −3548 | 4717 | 4379 | Re-dep slot 14 |
| RD-32 | 929 | 959 | 910 | 1016 | 19 | slot 15 |
| RD-33 | 1011 | 1231 | −13273 | 22548 | 14284 | Re-dep slot 16 |
| RD-34 | 637 | 883 | −4432 | 8563 | 5069 | Re-dep slot 17 |

Appendix - Table 4
RD-36 polish process

| wafer | DF(psi) | BP (psi) | Flow (ml/min) | Platen (rpm) | Carrier (rpm) | Pol. Time (sec.) | Slurry | Polish pad |
|---|---|---|---|---|---|---|---|---|
| rd-pol5 | 3 | 1 | 150 | 85 | 80 | 30 | RD-36 | IC1000 xy groove |
| | 1 | 0 | 150 | 40 | 35 | 30 | RD-36 | IC1000 xy groove |
| rd-pol6 | 3 | 1 | 150 | 85 | 80 | 15 | RD-36 | IC1000 xy groove |
| | 1 | 0 | 150 | 40 | 35 | 60 | RD-36 | IC1000 xy groove |
| touch polish | 3 | 1 | 150 | 85 | 80 | 20 | RD-36 | IC1000 xy groove |
| touch polish | 1 | 0 | 150 | 40 | 35 | 30 | RD-36 | IC1000 xy groove |
| rd-pol7 | 3 | 1 | 150 | 85 | 80 | 30 | RD-36 | Politex embossed pad |
| | 1 | 0 | 150 | 40 | 35 | 30 | RD-36 | Politex embossed pad |
| rd-pol8 | 3 | 1 | 150 | 85 | 80 | 30 | RD-36 | Politex embossed pad |
| | 1 | 0 | 150 | 40 | 35 | 60 | RD-36 | Politex embossed pad |

What is claimed is:

1. A method for dished metal redevelopment of a semiconductor wafer by moving a surface of the wafer against a moving polishing pad, the method comprising the steps of:
    providing an electroless plating solution at an interface between the wafer and the polishing pad, the wafer having dished metal within trenches of an interlayer dielectric from a previous manufacturing operation and the electroless plating solution having a chloride leveler, an electrolyte of metal ions, a metal-ion complexing agent and a reducing agent;
    depositing electroless plated metal onto the dished metal within the trenches of the interlayer dielectric from the electroless plating solution without depositing the electroless plated metal on the interlayer dielectric to redevelop the trenches of the interlayer dielectric; and
    polishing the wafer to polish metal with a reduced polishing pressure during electroless deposition onto the dished trenches to replace the dished metal of the trenches of the interlayer dielectric and redevelop the semiconductor wafer.

2. The method as recited in claim 1 wherein the step of providing a plating solution includes an adjusted pH greater than about 9.

3. The method as recited in claim 1 including the additional step of polishing the wafer to remove the electroless plated metal to the same planar level as the surface of a metal-migration barrier film on the interlayer dielectric.

4. The method as recited in claim 1 wherein the depositing electroless plated metal occurs with the electroless plating solution being an electroless copper plating solution having $CuSO_4$, $NH_4Cl$ and an adjusted pH>9.

5. The polishing fluid as recited in claim 4 wherein the depositing electroless plated metal occurs with the electroless plating solution having an adjusted pH>11.

6. A method for dished copper redevelopment of a semiconductor wafer by moving a surface of the wafer against a moving polishing pad, the method comprising the steps of:
    providing an electroless plating solution at an interface between the wafer and the polishing pad, the wafer having dished copper within trenches of an interlayer dielectric from a previous chemical-mechanical polishing operation and the electroless plating solution having a chloride leveler, an electrolyte of copper ions, a copper-ion complexing agent and a reducing agent;
    depositing electroless plated copper onto the dished copper within the trenches of the interlayer dielectric from the electroless plating solution to redevelop the trenches of the interlayer dielectric without depositing the electroless plated copper on the interlayer dielectric; and
    polishing the wafer to polish copper with a reduced polishing pressure during electroless deposition onto the dished trenches to replace the dished copper of the trenches of the interlayer dielectric and redevelop the semiconductor wafer.

7. The method as recited in claim 6 wherein the step of providing a plating solution includes an adjusted pH greater than about 9.

8. The method as recited in claim 6 including the additional step of polishing the wafer to remove the electroless plated copper to the same planar level as the surface of a copper-migration barrier film on the interlayer dielectric.

9. The method as recited in claim 6 wherein the depositing electroless plated copper occurs with the electroless plating solution being an electroless copper plating solution having $CuSO_4$, $NH_4Cl$ and an adjusted pH>11.

10. The polishing fluid as recited in claim 9 wherein the depositing electroless plated copper occurs with the electroless plating solution having an adjusted pH>11.

* * * * *